(12) United States Patent
Brandenburg et al.

(10) Patent No.: US 7,132,746 B2
(45) Date of Patent: Nov. 7, 2006

(54) ELECTRONIC ASSEMBLY WITH SOLDER-BONDED HEAT SINK

(75) Inventors: Scott D. Brandenburg, Kokomo, IN (US); Bruce A. Myers, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/643,043

(22) Filed: Aug. 18, 2003

(65) Prior Publication Data

US 2005/0040518 A1    Feb. 24, 2005

(51) Int. Cl.
  *H01L 23/34*  (2006.01)
  *H01L 23/473* (2006.01)
  *H01L 23/372* (2006.01)
  *H01L 23/52*  (2006.01)

(52) U.S. Cl. ............... 257/713; 257/E25.031; 257/E23.106; 257/E23.209; 257/E23.089; 257/E23.207; 257/E23.064; 257/E23.065; 257/E23.07; 257/E23.277; 257/712; 257/717; 257/720; 257/710; 257/704; 257/686; 257/723; 257/685; 361/784

(58) Field of Classification Search ............... 257/675, 257/720, 712–714, 684–687, 717, 710, 704, 257/778, 737, 738, 723, E25.031, E23.106, 257/E23.109, E23.089, E23.064, E23.065; 361/784
See application file for complete search history.

(56) References Cited

U.S. PATENT DOCUMENTS

| | | | |
|---|---|---|---|
| 4,034,468 A | | 7/1977 | Koopman |
| 4,081,825 A | * | 3/1978 | Koopman et al. .......... 257/713 |
| 4,323,914 A | * | 4/1982 | Berndlmaier et al. ...... 257/713 |
| 5,074,456 A | * | 12/1991 | Degner et al. ............. 228/121 |
| 5,325,265 A | * | 6/1994 | Turlik et al. ................ 361/702 |
| 5,371,404 A | * | 12/1994 | Juskey et al. ............... 257/659 |
| 5,396,403 A | * | 3/1995 | Patel ........................ 361/705 |
| 5,608,610 A | * | 3/1997 | Brzezinski ................. 361/704 |
| 5,724,729 A | * | 3/1998 | Sherif et al. ................. 29/840 |
| 5,751,062 A | * | 5/1998 | Daikoku et al. ............ 257/722 |
| 5,869,831 A | * | 2/1999 | De La Mora et al. ...... 250/288 |
| 5,931,222 A | * | 8/1999 | Toy et al. ................... 165/80.3 |
| 5,982,038 A | * | 11/1999 | Toy et al. .................... 257/772 |

(Continued)

FOREIGN PATENT DOCUMENTS

DE      19722357      11/1998

(Continued)

OTHER PUBLICATIONS

Massalski T B: "Binary Alloy Phase Diagrams" Binary Alloy Phase Diagrams. AC-AU to FE-RH, Ohio, American Society for Metals, US, vol. 1, 1986, pp. 268, 270-271. XP002177614 *p. 270*.

(Continued)

*Primary Examiner*—Alexander Oscar Williams
(74) *Attorney, Agent, or Firm*—Jimmy L. Funke

(57) ABSTRACT

A process and electronic assembly for conducting heat from a semiconductor circuit device mounted to a substrate. The substrate is supported by a housing member equipped with a heat-conductive member. A surface of the device opposite the substrate is bonded to the heat-conductive member with a solder joint formed of indium and optionally one or more alloying constituents that increase the melting temperature of the solder joint above that of indium. The housing member, substrate, and device are assembled so that an indium-containing solder material is present between the heat-conductive member and the surface of the device opposite the substrate. The solder material is then reflowed to form the solder joint. The alloying constituent(s) are preferably introduced into the solder joint during reflow.

16 Claims, 1 Drawing Sheet

U.S. PATENT DOCUMENTS

| | | | |
|---|---|---|---|
| 6,015,722 A * | 1/2000 | Banks et al. | 438/108 |
| 6,180,436 B1 * | 1/2001 | Koors et al. | 438/117 |
| 6,238,938 B1 * | 5/2001 | Smith | 438/10 |
| 6,307,749 B1 | 10/2001 | Daanen et al. | |
| 6,423,570 B1 * | 7/2002 | Ma et al. | 438/106 |
| 6,504,242 B1 * | 1/2003 | Deppisch et al. | 257/707 |
| 6,504,723 B1 | 1/2003 | Fitzgerald et al. | |
| 6,674,948 B1 * | 1/2004 | Yeh et al. | 385/120 |
| 6,717,819 B1 * | 4/2004 | Chung | 361/760 |
| 6,867,978 B1 * | 3/2005 | Whittenburg et al. | 361/719 |
| 2001/0026957 A1 * | 10/2001 | Atwood et al. | 438/122 |
| 2002/0020912 A1 * | 2/2002 | Dishongh et al. | 257/712 |
| 2003/0134454 A1 * | 7/2003 | Houle | 438/122 |
| 2003/0150635 A1 * | 8/2003 | Smith | 174/52.2 |
| 2003/0234074 A1 * | 12/2003 | Bhagwagar | 156/325 |
| 2004/0151885 A1 * | 8/2004 | Jayaraman et al. | 428/210 |
| 2004/0188503 A1 * | 9/2004 | Hua | 228/254 |
| 2004/0262740 A1 * | 12/2004 | Matayabas et al. | 257/706 |
| 2005/0041406 A1 * | 2/2005 | Matayabas et al. | 361/784 |

FOREIGN PATENT DOCUMENTS

| | | |
|---|---|---|
| DE | 19722357 C1 * | 11/1998 |
| EP | 0981159 | 2/2000 |
| JP | 61014096 | 1/1986 |
| WO | 0219424 | 3/2002 |

OTHER PUBLICATIONS

Shimizu K et al.: "Solder Joint Reliability of Indium-Alloy Interconnection" Journal of Electronic Materials, Warrendale, PA, US, vol. 24, No. 1, Jan. 1995, pp. 39-45, XP000853947, *col. 9, paragraph 2-col. 10* *Figures 13, 14*.

Chen Y-C et al.: "A fluxless bonding technology using indium-silver multilayer composites" IEEE Transactions on Components, Packaging, and Manufacturing Technology, Part A IEEE USA, vol. 20, No. 1, Mar. 1997, pp. 46-51, XP002369584, ISSN: 1070-9886 *figure 1*.

* cited by examiner

ELECTRONIC ASSEMBLY WITH SOLDER-BONDED HEAT SINK

BACKGROUND OF THE INVENTION (1) Field of the Invention

The present invention generally relates to thermal management of semiconductor devices. More particularly, this invention relates to a process and electronic assembly for increasing the dissipation of heat from semiconductor circuit devices, such as power flip chips.

(2) Description of the Related Art

Power flip chips and certain other semiconductor devices require thermal management in order to minimize their operating temperatures. A variety of approaches have been developed for dissipating heat generated by power flip chips. Notable techniques are disclosed in commonly-assigned U.S. Pat. Nos. 6,180,436 and 6,365,964 to Koors et al., which involve conducting heat from a circuit device with a heat-conductive pedestal brought into thermal contact with a surface of the device, e.g., the non-active "topside" surface of a flip chip opposite the solder connections that attach the chip to its substrate. A thermally-conductive lubricant, such as a silicone grease, is placed between the topside of the device and the pedestal to fill gaps between the device and pedestal in order to promote thermal contact, as well as decouple lateral mechanical strains that arise as a result of different thermal expansions and movement between the device, substrate and pedestal. An elastomer or other suitable biasing member urges the device into contact with the pedestal, promoting intimate contact between the device and pedestal to minimize the interface thermal resistance therebetween.

To further reduce induced stresses and to eliminate the need for thermally-conductive lubricants, co-pending U.S. Pat. No. 6,700,195 to Mandel discloses mounting a power flip chip (or other circuit device) within a first region of a substrate. The first region is peripherally supported by a second region of the substrate surrounding the first region, which in turn is supported by a third region of the substrate surrounding the second region. The second region is fabricated to be more flexible than the first and third regions. The device is contacted by a heat-conductive member, and a biasing member contacts the first region of the substrate to bias the device into thermal contact with the heat-conductive member. An important advantage of the assembly disclosed by Mandel is that the more flexible second region of the substrate improves the mechanical decoupling of strains that arise as a result of different thermal expansions and movement between the device, substrate, and heat-conductive member, thereby reducing the induced stresses that can cause fracturing of the device and its solder connections.

While the teachings of Koors et al. and Mandel provide significant improvements for thermally managing circuit devices, further improvements would be desirable, particularly as higher power densities are sought for circuit assemblies.

BRIEF SUMMARY OF THE INVENTION

The present invention is directed to a process and an electronic assembly for conducting heat from a semiconductor device, such as a power flip chip. The assembly is constructed to dissipate heat from a circuit device mounted to a substrate supported by a housing member equipped with a heat-conductive member. The circuit device is mounted to the substrate with solder connections that are registered with conductors on the substrate. According to the invention, the surface of the device opposite the solder connections is bonded to the heat-conductive member of the housing member by a solder joint consisting essentially of indium and optionally one or more alloying constituents that increase the melting temperature of the solder joint above that of indium. The solder joint serves to bond the second surface of the device to the heat-conductive member, such that heat is conducted away from the device with the heat-conductive member.

The process of this invention involves providing the housing member, substrate, and circuit device as discussed above, wherein these components are assembled so that a solder material is present between the heat-conductive member and the surface of the device opposite its solder connections. The solder material is then reflowed to form the solder joint noted above, and therefore consists essentially of indium and optionally one or more alloying constituents that increase the melting temperature of the solder joint above that of indium. According to a preferred aspect of the invention, the solder material is initially indium and the one or more alloying constituents are introduced into the solder joint during the reflow operation, so that the solder material initially melts at a first temperature but then solidifies as the alloying constituents alloy with the solder material.

A significant advantage of the process and assembly of this invention is that the indium-containing solder joint has a much higher thermal conductivity than conductive lubricants employed in the past, thereby improving the thermal performance of the assembly. The high bulk thermal conductivity of indium (about 86 W/mK) also allows the solder joints to be much thicker than the device-to-pedestal interfaces of the past, which in the case of a housing member having integral heat-conductive members, e.g., pedestals, allows for a larger pedestal-to-pedestal tolerance on the housing member which reduces the machining requirements, especially for substrates carrying multiple circuit devices that require heat sinking. Also as a result of the indium content, the solder joint is sufficiently ductile to mechanically decouple strains that arise as a result of different thermal expansions and movement between the device, substrate, and heat-conductive member, thereby reducing the induced stresses that can cause fracturing of the circuit device and its solder connections. Furthermore, the bond strength provided by the solder joint permits the omission of a biasing member of the type previously used to bias flip chips into contact with heat-conductive members.

Another advantage of the invention is that the use of the indium-containing solder joint can be incorporated into a manufacturing procedure with minimal impact on the procedure. For example, the low melting temperature of indium (157° C.) permits other solder connections (e.g., between the circuit device and substrate) to be formed prior to reflowing the indium-containing solder material, without reflowing such connections during the reflow operation performed to form the indium-containing solder joint. If an alloying constituent capable of increasing the melting temperature of the solder joint is introduced during the reflow process, the solder joint solidifies as the alloying constituent diffuses into the solder joint. A sufficient amount of alloying constituent can be introduced in this manner so that the final melting temperature of the solder joint is sufficiently high to permit subsequent processing, such as curing an overmold compound deposited to encapsulate the substrate and circuit device, without adversely affecting the bond formed by the solder joint between the circuit device and the heat-conductive member.

Other objects and advantages of this invention will be better appreciated from the following detailed description.

DETAILED DESCRIPTION OF THE INVENTION

Figure 1:
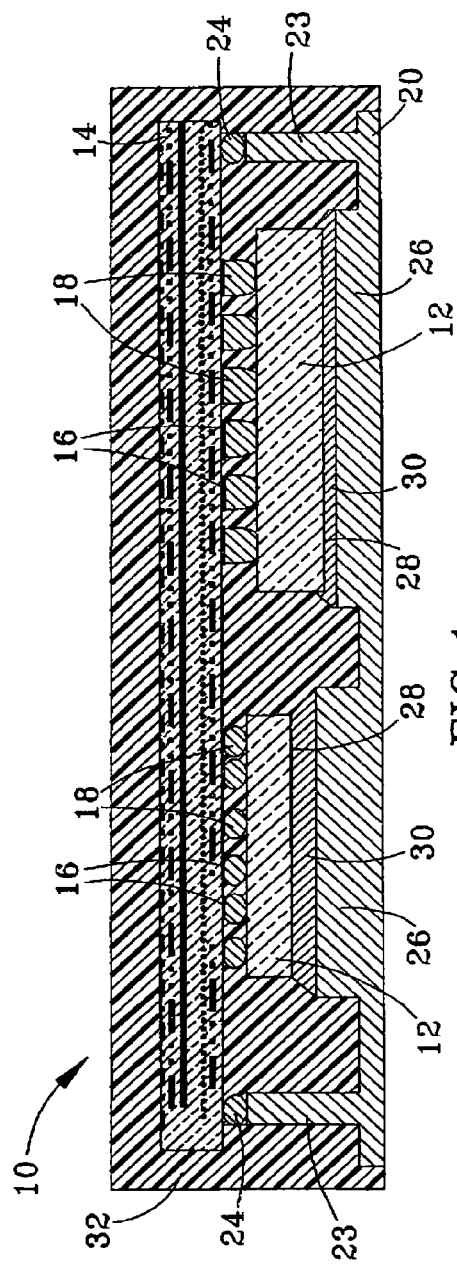
FIG. 1 is a cross-sectional view of an overmolded package containing flip chip devices mounted to a substrate, with a heat-conductive member contacting the topside (non-active side) of each device.

FIG. 1 shows an electronic assembly 10 containing a pair of power flip chip devices 12 (represented as a flip chip and a ball grid array (BGA)) attached with solder connections 18 to conductors 16 on a substrate 14. (As used herein, the term "flip chip" is intended to encompass a variety of integrated circuit chips having bond pads on the active side of the chip (the surface of the chip containing the active circuit elements), and on which solder bumps (or other types of flip-chip attach methods) are formed for attaching the chip to conductors on a substrate.) The substrate 14 preferably has a laminate construction (such as a printed wiring board (PWB)), though a variety of other substrate constructions could be used. The assembly 10 includes a backplate 20 with which the substrate 14 is supported. Edges of the substrate 14 are shown bonded to raised features 23 of the backplate 20 with a structural adhesive 24, suitable examples of which are well known in the art. Finally, an overmold compound 32 is shown as completely encasing the devices 12 and substrate 14 on the surface of the backplate 20, as well as underfilling the devices 12 and encapsulating their solder connections 18. As known in the art, the overmold compound 32 forms a protective, moisture-impermeable seal around the substrate 14 and its circuit devices 12, while underfilling the devices 12 improves the thermal cycle life of their solder connections 18. A preferred overmold compound 32 for this purpose is a thermoset epoxy, such as those disclosed in commonly-assigned U.S. Pat. No. 6,307,749 to Daanen et al.

Prior to placing the substrate 14 on the backplate 20, the devices 12 are mounted to the substrate 14 by a suitable flip-chip technique, in which performed solder bumps on the active sides of the devices 12 are registered with and reflow soldered to the conductors 16 on the surface of the substrate 14 to yield the solder connections 18. While two devices 12 are depicted in FIG. 1, any number of devices could be attached to the substrate 14. Furthermore, while the devices 12 are portrayed as a flip chip and a BGA, the present invention is generally directed to any type of heat-generating device that utilizes solder connections to provide physical and electrical connection to a substrate.

The backplate 20 is shown as being configured to define two pedestals 26 that project from the surface of the backplate 20 into an interior region of the backplate 20 to engage the topside (non-active side) 28 of each device 12. The pedestals 26 serve as heat sinks to conduct heat away from the devices 12. As such, the backplate 20 and its pedestals 26 are preferably formed of a thermally-conductive material, such as aluminum or copper, though other metallic and nonmetallic materials could be used. While shown as being integrally formed as portions of the backplate 20, the pedestals 26 could be separately formed and attached to the backplate 20. To facilitate manufacturing, the entire backplate 20, including integrally-formed pedestals 26, can be formed by molding, stamping, machining, etc. The backplate 20 can be equipped with cooling fins (not shown) to further promote heat dissipation to the environment.

As evident from FIG. 1, the assembly 10 does not make use of a biasing member to urge the devices 12 into engagement with the pedestals 26. Instead, the topsides 28 of the devices 12 are physically bonded to their respective pedestals 26 with solder joints 30. Each solder joint 30 is an indium-based solder, preferably an alloy of indium and one or more elements that will alloy with indium to form a solder having a higher melting temperature than indium (i.e., above 157° C.), preferred examples of which include gold, silver, nickel, nickel-gold alloys, tin, and tin alloys.

According to a preferred aspect of the invention, one or more of the above-noted alloying constituents are introduced into the solder joint 30 through their presence as discrete layers on the pedestals 26 and/or the topsides 28 of the devices 12. For example, the solder joint 30 can be formed by plating the topsides 28 of the devices 12 with gold or silver, plating the pedestals 26 with nickel, nickel-gold alloy, tin or tin alloy, placing an indium preform so that the preform is between the pedestals 26 and the topsides 28 of the devices 12 following assembly of the substrate 14 with the backplate 20, and then heating the assembly 10 to a temperature above 157° C. (e.g., about 168° C. to about 172° C.) for a sufficient time (e.g., about two to about four minutes) to melt the indium preform and dissolve and diffuse a sufficient amount of the constituents into the molten preform. In so doing, the liquidus temperature of the resulting mixture is increased to something above 157° C., such as about 165° C. to about 170° C., causing the mixture of indium and the alloying constituents to solidify and form the solder joint 30. As examples, additions of, by weight, about 0.1%, 0.3%, 0.5% and 2% gold to indium will yield alloys whose liquidus temperatures are about 170° C., 195° C., 220° C., 250° C., and 290° C., respectively, while additions of, by weight, about 0.1%, 0.2%, 0.4% and 1% nickel to indium will yield alloys whose liquidus temperatures are about 190° C., 215° C., 260° C., 300° C., respectively. In each case, the sharp increase in liquidus temperature resulting from very small additions of the alloying constituent will result in rapid solidification of the solder joint while the joint is held at the reflow temperature.

As a particular example of the above, the topside (non-active side) of a device can be plated with about 0.05 to about 0.6 micrometers of gold metallization, the backplate pedestal can be plated with nickel (or a nickel-gold alloy, tin or a tin alloy) to a thickness of about two to about four micrometers, between which a substantially pure indium preform having a thickness of about 50 to about 150 micrometers can be placed. Holding this assembly at a temperature of about 170° C. for about five minutes is sufficient to cause the indium preform to melt and dissolve at least some of the plated layers on the device and pedestal, respectively. As the alloying content of the molten indium preform increases, the liquidus temperature of the molten preform increases rapidly, causing rapid solidification. If the thicknesses of the gold plating, nickel plating and indium preform are about 0.2, about 2 and about 100 micrometers, respectively, the solder joint consists of about 0.1 weight percent gold, about 0.1 weight percent nickel, the balance indium and any unavoidable impurities,: and has a liquidus temperature of about 170° C. If the thicknesses of the gold plating, nickel plating and indium preform are about 0.6, about 4 and about 50 micrometers, respectively, the solder joint consists of about 0.5 weight percent gold, about 0.5 weight percent nickel, the balance indium and any unavoidable impurities, and has a liquidus temperature of about 220° C. In each case, the solder joint has a liquidus temperature that is higher than temperatures subsequently used during the application and curing cycle for the overmold compound 32, e.g., about 150° C. to about 160° C.

Advantageously, suitable reflow temperatures (e.g., 170° C.) for the solder joint 30 are well below reflow temperatures typically employed to form the solder connections 18, e.g., a reflow temperature of about 235° C. for solder connections 18 formed of Sn—Pb—Cu solder alloys (for example, with a liquidus temperature of about 190° C.) and eutectic Sn—Pb solder alloy (melting temperature of about 183° C.), as well as connections 18 formed of lead-free solder alloys. As such, temperatures required to melt the indium preform and form the indium alloy solder joint 30 do not pose a risk to the solder connections 18. Furthermore, the reflow temperature of the solder joint 30 is compatible with curing cycles for adhesives of the type suitable for use as the structural adhesive 24 that adhesively bonds the substrate 14 to the backplate 14, such that these operations can be performed simultaneously. For this purpose, the pedestal-to-backplate tolerances are preferably such that urging the substrate 14 into contact with the raised features 23 of the backplate 20 results in the application of a force on the indium preform that clamps the preform between the devices 12 and their pedestals 26.

Figure 2:
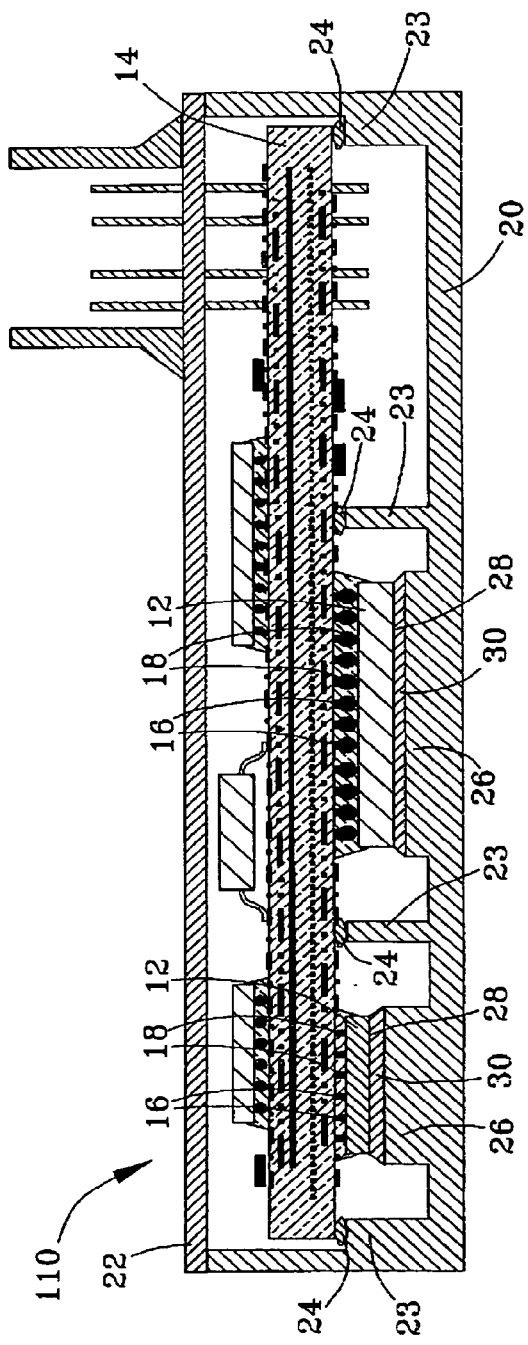
FIG. 2 is a cross-sectional view of a non-overmolded package containing flip chip devices mounted to a substrate, with a heat-conductive member contacting the topside of each device.

FIG. 2 represents an assembly 110 in accordance with a second embodiment of this invention, in which reference numerals used in FIG. 1 are used to identify similar assembly components, e.g., circuit devices 12 attached to a substrate 14. In FIG. 2, the circuit devices 12 and substrate 14 are underfilled but not overmolded; instead, the devices 12 and substrate 14 are enclosed within a housing formed by modifying the backplate 20 to accept a cover 22 that can be attached to the backplate 20, e.g., with fasteners or adhesive (not shown). The substrate 14 is again bonded to the backplate 20 with a structural adhesive 24 placed between the substrate 14 and raised features 23 defined on the backplate 20.

Thermal resistance testing has shown that assemblies of the type represented in FIGS. 1 and 2 provide a significant improvement (about 2×) in thermal performance, which is attributable to the use of the indium alloy solder joint 30 instead of conventional conductive lubricants between the devices 12 and their pedestals 26. Such an improvement arises from the high bulk thermal conductivity of indium (about 86 W/mK) and its alloys, which is more than one hundred times higher than the bulk thermal conductivity of thermal greases typically used in the prior art. Furthermore, intermetallic bonds occur between the solder joint 30, the topsides 28 of the devices 12, and the pedestals 26, yielding interfacial thermal resistances that are much lower than the interfacial thermal resistances of thermal greases and adhesives.

In addition to the above, the coefficient of thermal expansion (CTE) of indium (about 29 ppm/° C.) favorably matches that of materials suitable for the substrate 14 and backplate 20, particularly in comparison to thermally-conductive silicone adhesives used in similar applications. Indium is sufficiently ductile so that, in combination with its low CTE, the solder joint 30 is able to withstand higher stresses than epoxy and silicone joints. Finally, overmolding as shown in FIG. 1 encapsulates the devices 12 and solder joints 30, increasing the reliability of the joints 30 by 1.5× and more.

While the invention has been described in terms of a preferred embodiment, it is apparent that other forms could be adopted by one skilled in the art. Accordingly, the scope of the invention is to be limited only by the following claims.

The invention claimed is:

1. An electronic assembly comprising:
   a housing member comprising a heat-conductive member;
   a substrate supported by the housing member, the substrate having conductors on a surface thereof;
   a circuit device mounted to the substrate with solder connections on a first surface of the device that are registered with the conductors on the substrate, the device having a second surface oppositely disposed from the first surface; and
   a solder joint consisting essentially of an indium preform into which one or more alloying constituents have diffused to increase the melting temperature of the solder joint above that of the indium preform, the solder joint bonding the second surface of the device to the heat-conductive member; and
   an overmold compound that encapsulates the substrate, the device, and the solder joint on the housing member, the overmold compound having a cure temperature approximately equal to the melting temperature of indium but less than the melting temperature of the solder joint so as to enable curing of the overmold compound without adversely affecting the bond formed by the solder joint between the device and the heat-conductive member;
   wherein a thermally-conductive lubricant means is not present between the second surface of the device and the heat-conductive member.

2. The electronic assembly according to claim 1, wherein the solder joint comprises indium and at least one of gold and silver in an amount of up to 0.5 weight percent.

3. The electronic assembly according to claim 1, wherein the solder joint comprising indium and at least one of nickel, nickel-gold alloy, tin, and tin alloy in an amount of up to 0.5 weight percent.

4. The electronic assembly according to claim 1, wherein the solder joint consists essentially of indium, at least one of gold and silver in an amount of up to 0.5 weight percent, and at least one of nickel, nickel-gold alloy, tin and tin alloy in an amount of up to 0.5 weight percent.

5. The electronic assembly according to claim 1, wherein the melting temperature of the solder joint is below the melting temperature of the solder connections.

6. The electronic assembly according to claim 1, further comprising a structural adhesive bonding the substrate to the housing, the structural adhesive having a cure temperature approximately equal to the melting temperature of indium but less than the melting temperature of the solder joint so as to enable simultaneous curing of the structural adhesive and the diffusion of the one or more alloying constituents into the indium preform.

7. The electronic assembly according to claim 1, wherein the heat-conductive member is a pedestal protruding from the housing member.

8. The electronic assembly according to claim 1, wherein a portion of the housing member defines the heat-conductive member.

9. The electronic assembly according to claim 1, wherein the assembly lacks any biasing means that contacts a surface of the substrate opposite the device and urges the device into contact with the heat-conductive member.

10. An electronic assembly comprising:
a housing having an interior region;
a heat-conductive pedestal projecting into the interior region of the housing;
a laminate substrate within the interior region of the housing and supported by the housing, the substrate having conductors on a surface thereof;
a circuit device mounted to the substrate with solder connections on a first surface of the device that are registered with the conductors on the substrate, the device having a second surface oppositely disposed from the first surface; and
a solder joint consisting essentially of an indium preform into which at least one alloy constituent has diffused to increase the melting temperature of the solder joint above that of the indium preform but less than the solder connections, the solder joint bonding the second surface of the device to the heat-conductive pedestal; and
a structural adhesive bonding the substrate to the housing, the structural adhesive having a cure temperature approximately equal to the melting temperature of indium but less than the melting temperature of the solder joint so as to enable simultaneous curing of the structural adhesive and diffusion of the one or more alloying constituents into the indium preform;
wherein a thermally-conductive lubricant is not present between the second surface of the device and the heat-conductive member.

11. The electronic assembly according to claim 10, wherein the solder joint contains gold or silver in an amount of about 0.1 to about 0.5 weight percent.

12. The electronic assembly according to claim 10, wherein the solder joint contains one of nickel, nickel-gold alloy, tin, and tin alloy in an amount of about 0.1 to about 0.5 weight percent.

13. The electronic assembly according to claim 10, wherein the solder joint consists essentially of indium, at least one of gold and silver in an amount of about 0.1 to 0.5 weight percent, and at least one of nickel, nickel-gold alloy, tin, and tin alloy in an amount of about 0.1 to 0.5 weight percent.

14. The electronic assembly according to claim 10, wherein the housing comprising a base member and a cover member that enclose the substrate and the device.

15. The electronic assembly according to claim 14, wherein an overmold compound does not encapsulate the substrate and the device.

16. The electronic assembly according to claim 10, wherein a portion of the housing defines the pedestal.

* * * * *